United States Patent [19]

Swann et al.

[11] Patent Number: 4,833,330
[45] Date of Patent: May 23, 1989

[54] ANTICONTAMINATOR FOR TRANSMISSION ELECTRON MICROSCOPES

[75] Inventors: Peter R. Swann, Diablo; Joseph S. Jones, Livermore, both of Calif.

[73] Assignee: Gatan Inc., Pleasanton, Calif.

[21] Appl. No.: 116,039

[22] Filed: Nov. 3, 1987

[51] Int. Cl.4 .............................................. H01J 37/20
[52] U.S. Cl. ................ 250/443.1; 250/442.1; 62/51.1
[58] Field of Search ............ 250/310, 311, 443.1, 250/442.1; 62/514 R

[56] References Cited

U.S. PATENT DOCUMENTS

| | | | |
|---|---|---|---|
| 3,124,680 | 3/1964 | Van Dorsten et al. | 250/443.1 |
| 3,373,277 | 3/1968 | Heide | 250/443.1 |
| 3,611,746 | 10/1971 | Marsing et al. | 62/514 R |
| 3,624,390 | 11/1971 | Watanabe | 250/310 |

Primary Examiner—Carolyn E. Fields
Assistant Examiner—Jack I. Berman

[57] ABSTRACT

An improved electron microscope anticontaminator having a conduction rod enclosed within an independent vacuum system and micropositioning capability is described. The micropositioning facility allows the use of unusually small apertures in the cold anticontaminator block with a consequent improvement in efficiency of function. A self-contained contact sensor provides immediate audible warning of contact between a specimen holder and the cold anticontaminator block, permitting the removal of the usual mechanical end-stops for the specimen tilt mechanism and allowing the maximum specimen movement possible at any time. The independent vacuum system in combination with a heater positioned close to the anitcontaminator block allows the microscopist to vent the microscope column without removing the anticontaminator from the microscope. Special anticontaminator blocks incorporating multiple apertures or an X-ray collimator eliminate the need for separate microscope objective aperture or X-ray collimator mechanisms and also ease design constraints imposed by the very limited space around specimens in high resolution microscopes.

12 Claims, 4 Drawing Sheets

ANTICONTAMINATOR FOR TRANSMISSION ELECTRON MICROSCOPES

BACKGROUND OF THE INVENTION

1. Field of the Invention

The invention relates to anticontaminators for electron microscopes and especially to anticontaminators for side-entry transmission electron microscopes.

2. Description of Prior Art

Transmission electron microscopes (TEMs) are often supplied with an apparatus to minimize the deposition of contaminants such as carbon or ice which obscure specimen detail, distort the low energy region of X-ray spectra acquired from the specimen and make electron energy loss spectrometry impossible. The apparatus is generally known as an anticontaminator and comprises a dewar of liquid nitrogen mounted on the side of the TEM column with a conduction rod leading to a cold block onto which blades are mounted which surround the specimen. Presently available anticontaminators can be classified into two basic types.

Type 1 anticontaminators hold the liquid nitrogen coolant in an externally mounted, permanently sealed dewar and the conduction rod exits the microscope vacuum and dips into the liquid nitrogen coolant. The disadvantage of this arrangement is that the thermal efficiency of the anticontaminator is reduced by the additional heat flow into the short section of the cooling rod that is exposed to atmosphere in the space between the dewar and the microscope.

Type 2 anticontaminators hold the liquid nitrogen in a dewar which is continually evacuated by the microscope vacuum system. In this case the cooling rod does not exit the microscope vacuum and the thermal efficiency is therefore higher than the type 1 anticontaminators. However, because the Type 2 dewar uses the same vacuum system as the microscope the dewar must be emptied of liquid nitrogen whenever the microscope column is vented. This operation can be very tedious because vacuum seals must be broken in order to remove the dewar from the microscope to empty out the liquid nitrogen or alternatively the microscope operator must wait for the full reservoir of liquid nitrogen to be evaporated and the dewar heated to room temperature.

A further disadvantage shared by both Type 1 and Type 2 anticontaminators is that no provision is made for positioning the anticontaminator block during microscope operation. Positioning is desirable so that the entrance and exit holes for passage of the electron beam through the anticontaminator blades can made be as small as possible to achieve maximum degree of anticontamination and also to enable the blades to be removed completely from the specimen area if maximum specimen tilt becomes a priority.

Some manufacturers have incorporated contact sensors into their anticontaminators. At this time, however, these sensors have not made any allowance for the relatively high resistance of any ice layer which develops on the cold surface of the anticontaminator and they lack the sensitivity required for some applications.

Most users, therefore, would find it desirable to have an anticontaminator with its own self contained vacuum system, a high sensitivity contact sensor and an anticontaminator block with positioning capability.

OBJECTS AND ADVANTAGES

Accordingly the following objects and advantages are claimed for the invention: to provide an electron microscope anticontaminator having an independent vacuum or vacuum capable of being isolated from the microscope vacuum and having a cold block which may be moved by the user during microscope operation to allow precise alignment of the blade apertures with the electron beam or to completely withdraw the blade from the specimen region, to provide an anticontaminator with a heater close to the cold block to warm the block and blade sufficiently to prevent frosting when exposed to air yet, because the major portion of the conduction rod is within an independent vacuum, avoid the necessity of emptying the liquid nitrogen dewar.

Readers will find further objects and advantages of the invention from a consideration of the ensuing description and the accompanying drawings.

DRAWING FIGURES

Figure 1:
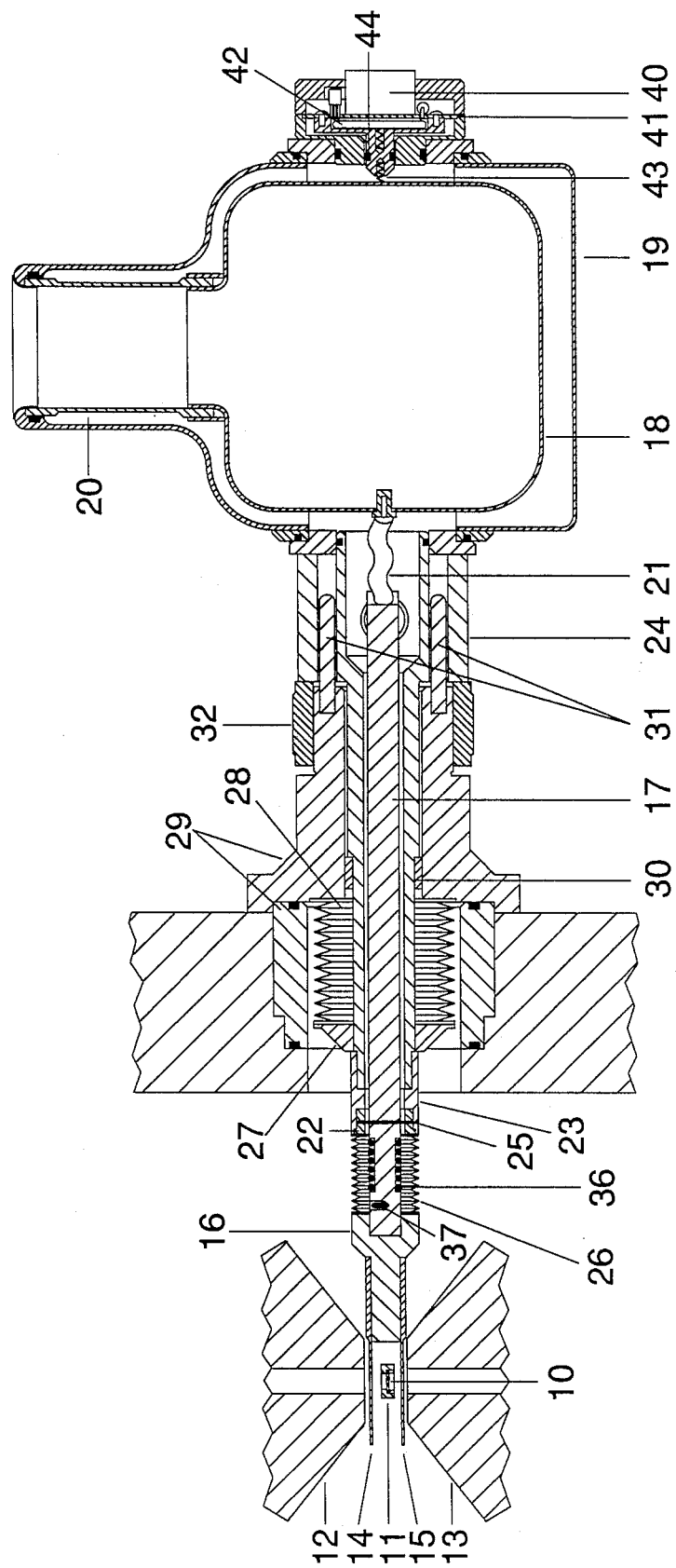
FIG. 1 shows a vertical section through the invention mounted on a transmission electron microscope.

| Drawing Reference Numerals | |
|---|---|
| 10 specimen | 11 specimen holder |
| 12 upper objective lens pole piece | 13 lower objective lens pole piece |
| 14 upper anticontaminator blade | 15 lower anticontaminator blade |
| 16 mounting block | 17 conduction rod |
| 18 liquid nitrogen reservoir | 19 outer vessel |
| 20 first insulating tube | 21 flexible foils |
| 22 short tube | 23 second insulating tube |
| 24 main support tube | 25 spindle |
| 26 first flexible bellows | 27 first collar |
| 28 second flexible bellows | 29 two-part flange |
| 30 bearing | 31 guide pins |
| 32 internally threaded ring | 33 first spring |
| 34 pin | 35 knob |
| 40 buzzer | 41 circuit board |
| 42 battery | 43 second spring |
| 44 first O-ring | 50 pipe |
| 51 flexible tube | 60 second collar |
| 61 pumping ports | 62 second O-ring |
| 70 X-ray detector | 71 X-ray collimator |

DESCRIPTION OF THE PREFERRED EMBODIMENT

FIG. 1 shows a vertical section through the invention mounted on a TEM according to the preferred embodiment.

Specimen 10, mounted in specimen holder 11, is positioned between upper and lower TEM objective lens pole pieces 12 and 13. Upper blade 14 and lower blade 15 are interposed between specimen 10 and pole pieces 12 and 13. Apertures in blades 14 and 15 permit passage of the electron beam. Blades 14 and 15 connect to mounting block 16. Conduction rod 17 leads to liquid nitrogen reservoir 18 which is enclosed within outer vessel 19. The space between reservoir 18 and outer vessel 19 is evacuated, thus insulating reservoir 18 and conduction rod 17. Reservoir 18 and outer vessel 19 are connected by first insulating tube 20. Flexible foils 21 connect end of conduction rod 17 to liquid nitrogen reservoir 18, forming a conduction path but permitting expansion, contraction or other limited movement of conduction rod 17 relative to reservoir 18.

Conduction rod 17 is contained within an assembly, comprising short tube 22, second insulating tube 23 and main support tube 24. Conduction rod 17 is free to rotate about spindle 25. First flexible bellows 26 seal mounting block 16 to short tube 22. Second flexible bellows 28 seals collar 27, mounted on main support tube 24, to two-part flange 29. Main support tube 24 is free to move within two-part flange 29. Bearing 30 and guide pins 31 restrict main support tube 24 to linear motion along its axis.

The vacuum inside the microscope column pulls the anticontaminator towards the specimen. Rotating internally threaded ring 32, turning on a thread on two-part flange 29 and contacting a shoulder on main support tube 24, moves the anticontaminator towards or away from the specimen.

Figure 2:
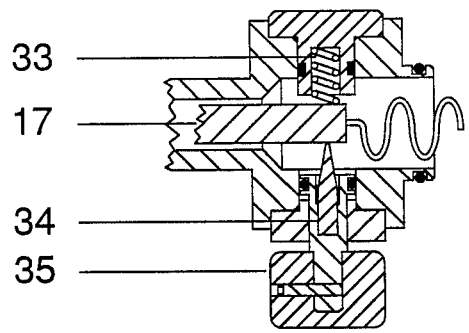
FIG. 2 shows a horizontal section through the transverse movement mechanism.

FIG. 2 is horizontal section through the transverse movement mechanism adjacent to the dewar. First spring 33 presses the end of conduction rod 17 against the tip of pin 34. Rotating knob 35 advances or withdraws pin 34 and in combination with first spring 33 moves the end of conduction rod 17 along an arc centered on spindle 25, thereby moving blades 14 and 15 (FIG. 1). Combined operation of knob 35 and ring 32 (FIG. 1) allow accurate positioning of blades 14 and 15 to ensure unobstructed passage of the electron beam through the apertures in blades 14 and 15. Second bellows 28 allows sufficient movement of blades 14 and 15 along the axis of the anticontaminator away from the specimen that the blades may be completely withdrawn from the vicinity of the specimen to allow unrestricted viewing of the specimen at very low magnification.

The efficiency of anticontaminators is largely dependent on the proportion of cooled surface 'visible' to the specimen. Heretofore, since it was not possible to accurately adjust the position of the anticontaminator blades during microscope operation, the upper and lower apertures had to be of large size. The micropositioning mechanisms in the present invention allow accurate alignment of the blades during microscope operation and mean that the upper and lower apertures can be reduced to the minimum dimensions consistent with unobstructed passage of the electron beam. Depending on the optics of the microscope this can be 1mm or smaller compared with several cm in existing anticontaminators. Thus the efficiency of the present invention is much higher than that of existing anticontaminators.

Referring to FIG. 1, heater 36 allows blades 14 and 15 to be warmed. This is necessary should it be required to admit air to the specimen area of the microscope for e.g. service purposes. If the blades were allowed to remain cold when air was admitted, water vapor would condense on the cold surfaces as ice. This would subsequently make it difficult to achieve a good vacuum after service work was completed. Heater 36 allows exposed blades 14 and 15 and mounting block 16 to be rapidly warmed. The temperature is monitored with sensor 37.

Since most of conduction rod 17 is contained within an independent vacuum and is well insulated from exposed surfaces, it is only necessary to warm the end of the anticontaminator before admitting air to the microscope. The length of conduction rod 17 means that liquid nitrogen reservoir 19 is only slightly affected by heater 36. Once the microscope has been evacuated of air, heater 36 is simply turned off and blades 14 and 15 rapidly cool down again.

Over a period of time, the independent vacuum inside the anticontaminator degrades. To ensure maximum effectiveness of operation, a valve situated in the wall of outer vessel 19 permits connection of the anticontaminator to a pumping system for regenerating the vacuum.

The space surrounding an electron microscope specimen, particularly in the case of a TEM, is very limited, especially if room is required for tilting the specimen holder. To prevent the specimen holder contacting the objective lens pole piece, objective aperture mechanism or anticontaminator, the manufacturer installs mechanical end-stops in the tilting mechanisms. These are designed for a 'worst-case' situation and in many instances place an unnecessary constraint on specimen tilting. However, it is important to avoid such contact which could result in misalignment of the microscope or damage. Additionally, should blades 14 and 15 of the present invention contact any part of the microscope or specimen holder, warming may occur, impairing effectiveness. While contact could be inferred by monitoring the temperature of blades 14 and 15 with temperature sensor 37, temperature monitoring would only normally be carried out when warming the blades with heater 36. Also, should a specimen cooling holder be in use, possibly damaging contact could occur without any warming of the blades.

Figure 3:
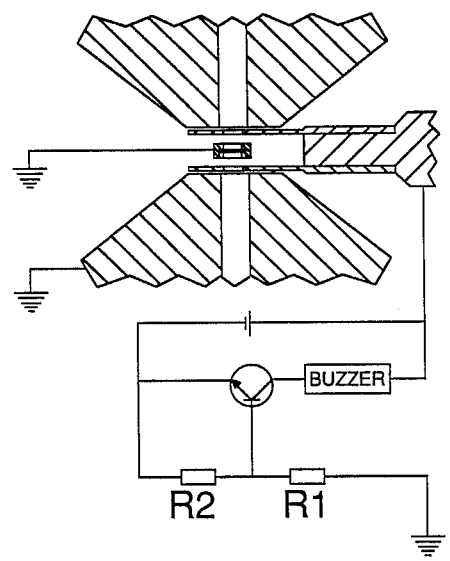
FIG. 3 shows the circuit diagram for the contact sensor.

To resolve these problems, the present invention has a self-contained contact sensor (FIG. 1). First insulating tube 20 and second insulating tube 23, in addition to ensuring thermal isolation of blades 14 and 15, conduction rod 17 and reservoir 18, provide electrical isolation. The contact sensor comprises buzzer 40 mounted on circuit board 41 and battery 42. Electrical contact is made with reservoir 18 via second spring 43. First O-ring 44 provides both a vacuum seal and electrical isolation. When the anticontaminator has been in operation for some time, water ice builds up on blades 14 and 15. A simple single transistor amplifier circuit (FIG. 3) overcomes the resistance of the water ice. Resistor R1 is connected to the microscope ground via an earthing strip on circuit board 41. All parts of the microscope and specimen holder are normally grounded. If, when moving anticontaminator blades or tilting the specimen, the blades contact the objective lens pole pieces, objective aperture mechanism or specimen holder, the circuit is completed and the buzzer sounds. This provides an immediate warning of undesirable contact, much more quickly than would monitoring the temperature, and since the contact sensor is completely self contained with its own power supply, the sensor continues to function even if the microscope power supply is switched off, as may occur e.g. during service work.

Figure 4:
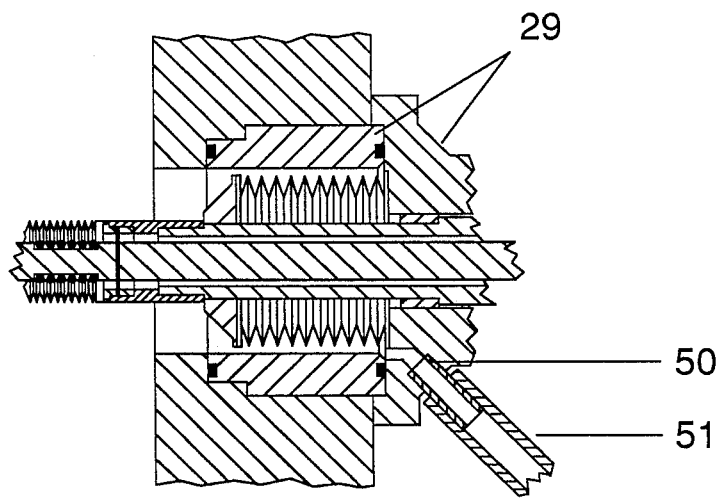
FIG. 4 shows a vertical section through part of the invention in a second embodiment.

FIG. 4, a section through the flange region of the invention, refers to a second embodiment of the invention. Tube 50 in two-part flange 29 connects via pipe 51 to the pumping valve in the wall of outer vessel 19. This connects the anticontaminator vacuum to the microscope vacuum and allows continual pumping of the anticontaminator, ensuring a good vacuum at all times. To prevent ice formation inside the anticontaminator when admitting air to the microscope, the valve in the wall of outer vessel 19 is closed, isolating the anticontaminator vacuum region.

Figure 5:
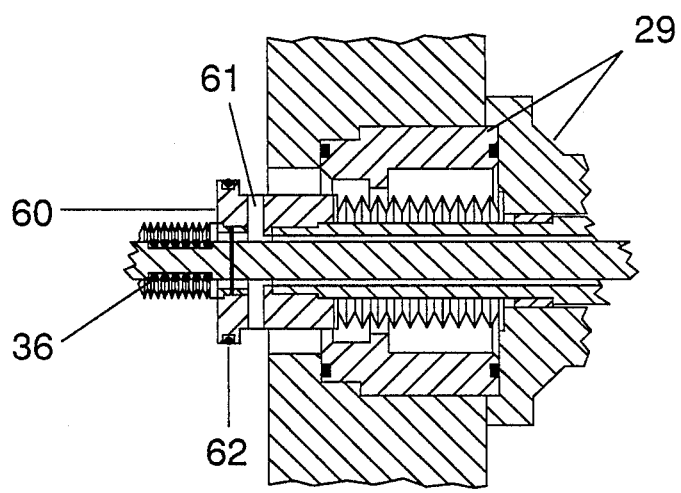
FIG. 5 shows a vertical section through part of the invention in a third embodiment.

FIG. 5, a section through the flange region of the invention, refers to a third embodiment of the invention.

Collar 60 provides a direct connection between the microscope vacuum and the vacuum region of the anticontaminator via ports 61. Before turning on heater 36, admitting air to the microscope or removing the anticontaminator from the microscope, the anticontaminator is fully withdrawn and second O-ring 62 seals against two-part flange 29 isolating the anticontaminator vacuum.

Figure 6:
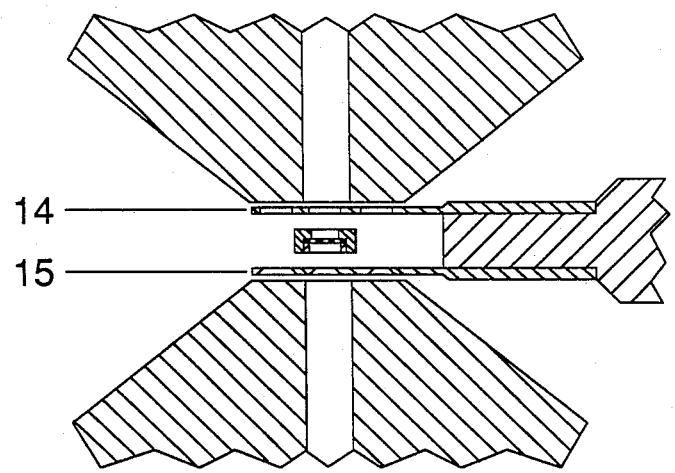
FIG. 6 shows a vertical section through a variation of the preferred embodiment

It is usual practice to improve TEM image contrast by placing an objective aperture in the back focal plane of the objective lens. TEM optics are typically designed such that this plane is just above the upper face of the lower objective lens pole piece. Clearly an objective aperture mechanism in this position places additional constraints on specimen tilting and imposes severe design limitations on an anticontaminator. In a variation on the preferred embodiment of the invention (FIG. 6) instead of having single apertures in upper and lower blades 14 and 15, a series of apertures of the appropriate dimensions are provided. These apertures function as objective apertures and the micropositioning mechanism of the invention allows correct electron optical alignment. The standard objective aperture mechanism is dispensed with, so easing the space limitations and allowing maximization of specimen movements.

Figure 7:
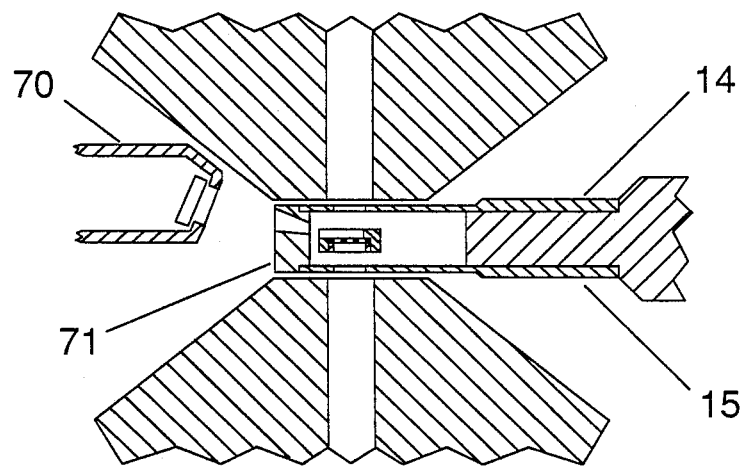
FIG. 7 shows a vertical section through a second variation of the preferred embodiment

FIG. 7 shows a second variation of the preferred embodiment. Many electron microscopes incorporate X-ray detectors 70 for compositional analysis of the specimen. To maximize the signal of interest from the specimen while minimizing the signal from the specimen holder is not a simple task and requires careful collimation of the X-rays. In this variation, X-ray collimator 71 is mounted directly on anticontaminator blades 14 and 15. This again has the advantage of easing space limitations and allowing maximization of specimen movements.

While the above description contains may specificities, the reader should not construe these as limitations on the scope of the invention but merely as exemplifications of the preferred embodiments thereof. Those skilled in the art will envisage other possible variations within its scope. For example, the signal-to-noise ratio of certain types of detector is improved by cooling and significant space savings could be made by incorporating such electron detectors in the cooled anticontaminator blades. Neither should it be construed that the invention is limited to any specific type of microscope. The invention is, for example, readily adapted to fit a scanning electron microscope.

What is claimed is:

1. A device for minimizing contamination of a specimen in an electron microscope comprising:
   a) a heat sink at low temperature;
   b) a structure adjacent to said specimen in said electron microscope;
   c) a thermal conductor connecting said structure with said heat sink and completely enclosed within an independent vacuum chamber; and
   d) a heater inside said independent vacuum chamber and in close contact with said thermal conductor and positioned immediately adjacent to said structure whereby the temperature of said structure may be rapidly raised above the local dew point without significantly affecting said heat sink to prevent condensation of water on said structure when air is admitted to said electron microscope.

2. A device as claimed in claim 1, further including a valve between said independent vacuum chamber and said electron microscope whereby the vacuum region of said electron microscope can be directly connected to said independent vacuum chamber to permit evacuation of said independent vacuum chamber by the vacuum of said electron microscope.

3. A device as claimed in claim 1, further including means for precisely adjusting the position of said structure during normal operation of said electron microscope without affecting the vacuum in said electron microscope whereby said structure can be accurately aligned with the optical axis of said electron microscope to optimize specimen observation at any magnification.

4. A device as claimed in claim 1, further including a contact sensor comprising:
   a) an amplifying circuit;
   b) an alarm device requiring a minimum current to operate; and
   c) a direct current electrical power source whereby contact between said structure and said electron microscope or a specimen holder is indicated even when the cooled surfaces are covered by a thin, electrically resistant layer of ice.

5. A device as claimed in claim 1 wherein said structure comprises upper and lower blades each having a plurality of small apertures whereby the device additionally acts as an objective aperture mechanism, permitting the standard objective aperture mechanism to be dispensed with, thereby allowing greater specimen tilt.

6. A device for minimizing specimen contamination in an electron microscope comprising:
   a) a heat sink at low temperature;
   b) a structure adjacent to said specimen in said electron microscope;
   c) a thermal conductor connecting said structure with said heat sink and completely enclosed within an independent vacuum chamber; and
   d) means for precisely adjusting the position of said structure during normal operation of said electron microscope without affecting the vacuum in said electron microscope whereby said structure can be accurately aligned with the optical axis of said electron microscope to optimize specimen observation at any magnification.

7. A device as claimed in claim 6, further including a valve between said independent vacuum chamber and said electron microscope whereby the vacuum region of said electron microscope can be directly connected to said independent vacuum chamber to permit evacuation of said independent vacuum chamber by the vacuum of said electron microscope.

8. A device as claimed in claim 6, further including a heater inside said independent vacuum chamber and in close contact with said thermal conductor and positioned immediately adjacent to said structure whereby the temperature of said structure may be rapidly raised above the local dew point without significantly affecting said heat sink to prevent condensation of water on said structure when air is admitted to said electron microscope.

9. A device as claimed in claim 6, further including a contact sensor comprising:
a) an amplifying circuit;
b) an alarm device; and
c) a direct current electrical power source whereby contact between said structure and said electron microscope or a specimen holder is indicated even when the cooled surfaces are covered by a thin, electrically resistant layer of ice.

10. A device as claimed in claim 6 wherein said structure comprises a plurality of blades having a plurality of apertures whereby the device additionally acts as an objective aperture mechanism, permitting the standard objective aperture mechanism to be dispensed with thereby allowing greater specimen tilt.

11. An anticontaminator for electron microscopes including an integral heater close to the cooled surfaces of said anticontaminator whereby the temperature of said structure may be rapidly raised above the local dew point without significantly affecting said heat sink to prevent condensation of water on said structure when air is admitted to said electron microscope.

12. An anticontaminator for electron microscopes including a valve to connect the liquid nitrogen dewar to the electron microscope vacuum whereby the vacuum of said liquid nitrogen dewar can be repumped by said electron microscope vacuum.

* * * * *